United States Patent
Werner et al.

(10) Patent No.: US 10,962,618 B2
(45) Date of Patent: Mar. 30, 2021

(54) MULTI-COMPONENT APPARATUS AND METHOD FOR ISOCHRONOUS COMMUNICATION THEREIN

(71) Applicant: Siemens Healthcare GmbH, Erlangen (DE)

(72) Inventors: Roland Werner, Langensendelbach (DE); Nikolaus Demharter, Dormitz (DE); Martin Nisznansky, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 35 days.

(21) Appl. No.: 16/414,046

(22) Filed: May 16, 2019

(65) Prior Publication Data
US 2019/0353734 A1 Nov. 21, 2019

(30) Foreign Application Priority Data
May 17, 2018 (DE) .......................... 102018207775.4

(51) Int. Cl.
*G01R 33/54* (2006.01)
*H04L 12/18* (2006.01)
(Continued)

(52) U.S. Cl.
CPC ......... *G01R 33/543* (2013.01); *G05B 19/042* (2013.01); *H04B 10/25* (2013.01);
(Continued)

(58) Field of Classification Search
CPC ....... G01R 33/543; G01R 33/28; H04L 12/18; H04B 10/25; H04B 10/5161; H04Q 11/0003; G05B 19/042; G05B 2219/2652
See application file for complete search history.

(56) References Cited

U.S. PATENT DOCUMENTS 5,633,871 A * 5/1997 Bloks ...................... H04J 3/247
370/471
6,477,181 B1 11/2002 Fujimori et al.
(Continued)

FOREIGN PATENT DOCUMENTS

DE 69735415 T2 9/2006
DE 102008017819 B3 12/2009
DE 102009036936 A1 2/2011

OTHER PUBLICATIONS

German action dated Apr. 24, 2019 for Application No. 10 2018 207 775.4.

*Primary Examiner* — G. M. A Hyder
(74) *Attorney, Agent, or Firm* — Schiff Hardin LLP

(57) ABSTRACT

In a method for isochronous communication of components of a multi-component apparatus, which communicate via peer-to-peer communication connections created by a switch, a periodic communication clock signal is provided by a control computer to all the components, with a communication window between two communication clock cycles of the communication clock signal, in which a communication information item of the isochronous communication is transferrable from a transferring component to at least one addressed component. A synchronization, in relation to the communication clock signal, between at least two of the components is produced by at least one synchronization message sent via the switch by one of the components to be synchronized to all the other components to be synchronized in a communication time window.

17 Claims, 3 Drawing Sheets

(51) Int. Cl.
    *H04B 10/25* (2013.01)
    *H04Q 11/00* (2006.01)
    *G05B 19/042* (2006.01)
    *H04B 10/516* (2013.01)

(52) U.S. Cl.
    CPC ......... *H04B 10/5161* (2013.01); *H04L 12/18* (2013.01); *H04Q 11/0003* (2013.01); *G05B 2219/2652* (2013.01)

(56) References Cited

U.S. PATENT DOCUMENTS

| | | | |
|---|---|---|---|
| 8,676,362 B2 * | 3/2014 | Gabel | G06F 3/162 700/94 |
| 2009/0251141 A1 * | 10/2009 | Baumgartl | G01R 33/36 324/307 |
| 2011/0040997 A1 * | 2/2011 | Baumgartl | G01R 33/543 713/401 |
| 2015/0121466 A1 * | 4/2015 | Brands | H04L 63/08 726/4 |
| 2016/0036525 A1 * | 2/2016 | Pirkl | H04B 10/07955 398/38 |

\* cited by examiner

MULTI-COMPONENT APPARATUS AND METHOD FOR ISOCHRONOUS COMMUNICATION THEREIN

BACKGROUND OF THE INVENTION

Field of the Invention

The present invention concerns a method for isochronous communication among components of a multi-component apparatus, which communicate via communication connections created by a switch that provides a peer-to-peer function. The invention also concerns a multi-component apparatus, in particular a magnetic resonance (MR) apparatus which operates according to such a method.

Description of the Prior Art

The large number of technical processes that are carried out by a multi-component apparatus impose exacting requirements on the temporal matching of the actions of different components and/or the temporally correct allocation of data or transport thereof in real time. Specific examples are medical imaging devices, such as magnetic resonance apparatuses in which, for imaging, different components of the imaging apparatus cooperate so as to provide the desired high-quality imaging result only with chronologically matched interaction. This problem is particularly important in magnetic resonance devices wherein, due to the different components thereof that respectively emit different types of pulses with a pulse sequence, in order to detect extremely rapidly occurring relaxation effects of nuclear spins. This imposes significant demands on the isochronicity and real time-capability of the control processors that control the image recording operation in a magnetic resonance apparatus. It is also the case, however, that magnetic resonance apparatuses produce a large quantity of data, which must be exchanged.

For communication within the control processor of the magnetic resonance apparatuses. It has therefore been proposed in the prior art to use at least two networks, specifically a first network for data exchange in which, for example, the PCI Express standard can be used, and a second network that is an isochronous network that uses, for example, point-to-point connections of the optical type between individual components of the control device, in order to form a ring topology ("isochronous optical ring"). Such an isochronous network uses its own communication lines and a proprietary protocol.

DE 10 2008 017 819 B3 discloses a magnetic resonance system and a method for operation thereof wherein different actuator components/functional units, for example, gradient coils and the like, are each controllable by at least one digital assembly and at least one analog assembly according to a control sequence. The analog assemblies are arranged externally with respect to a control computer that controls the digital assemblies, as well as externally with respect to the analog assembly or assemblies controlled thereby. The digital assemblies that correspond to the aforementioned control processors are networked for communication of the digital assemblies among one another and/or with the control computer by the following networks:
  a synchronous first network for synchronizing the digital assemblies,
  an isochronous or partially isochronous second network,
  a third network,
wherein the digital assemblies are connected to the control computer via serial peripheral component interfaces and thereby a signal transfer between the peripheral component interface of each digital assembly and the associated peripheral component interface of the control computer is achieved by optical means.

A synchronous first network is used for synchronizing the digital assemblies and the control computer that is, all the components of the control computer. By means of this network, the necessary synchronization information, for example, a system clock and, if relevant, time marks, are transferred. By means of the isochronous or partially isochronous network, it is ensured that certain data can be exchanged between the different network nodes within a certain time period, so that it is available with certainty at the relevant assemblies if, in accordance with this information, particular actions are to be carried out. This network can also be designated the control command network. In the third network which serves mainly for data transfer, PCI Express communication connections are preferably used.

PCI Express communication connections represent a well-known peripheral communication standard. Typically therein a switch is used with which, for the transport of a communication information item, a peer-to-peer connection can be created between components of the control computer that are connected to the switch.

DE 10 2009 036 936 A1 concerns the synchronization of clocks in autonomous components of a magnetic resonance system and the time-synchronous execution of commands in these components. Therein, an imaging system is described that has multiple components, each of which has a local clock, an input for commands including, in each case, a command execution for time allocation, a memory for commands received via the input, an input for a time-synchronizing signal, and a control processor that for executes the commands when a time indicated by the local clock matches with the command execution time point allocation. The commands can be transferred by a ring-shaped structure of a central control system to the components, by feeding at least two synchronization signals from a synchronization master into the ring-shaped structure in opposite directions.

PCI Express is not suitable, particularly in its early development stages, for an isochronous communication or a synchronization without further difficulty. The reason is that it cannot be predicted how and, above all, exactly when, communication information will be passed on from one component to the other component, since this is dependent on internal processes in the switch. However, a clear later development of this communication standard exists, so that significantly greater bandwidths and significantly faster anticipated communication times exist.

The use of additional networks, in particular the aforementioned "isochronous optical ring" entails a significant outlay. It is therefore desirable to achieve synchronicity and isochronicity in magnetic resonance apparatuses and, in general, multi-component apparatuses, with less effort, particularly with regard to the temporally correct execution of control commands.

SUMMARY OF THE INVENTION

It is therefore an object of the invention to provide a simplification of the communication routes within a multi-component apparatus, in particular a magnetic resonance apparatus, while still providing, where required, the necessary isochronicity and/or synchronicity.

This object is achieved by a method of the general type initially described, but wherein according to the invention, a periodic communication clock signal is provided to all the components of the multi-component apparatus, wherein, between two communication clock cycles of the communication clock signal, communication time windows are provided in which a communication information item of the isochronous communication is transferrable from a transferring component to at least one addressed component, and wherein a synchronization is created by the switch, in relation to the communication clock signal, between at least two of the components by at least one synchronization message sent by one of the components to be synchronized to all the other components to be synchronized in the communication time window.

The communication connections preferably involve optical PCI Express connections, so that with a suitable enhancement and extension, the inventive method provides via PCI Express, a synchronization or isochronous communication, so as to allow proprietary, networks to be dispensed with. This is because modern PCI Express switches already provide suitable properties in order to implement fundamentally the communication method described, in particular a peer-to-peer function, preferably even a multicast peer-to-peer function, and provide sufficient bandwidth for data traffic between end points or from and to a central computer device as the host. The multi-component apparatus in accordance with the invention can be a magnetic resonance apparatus, so that the described "isochronous optical ring" can be dispensed with, but all the time requirements can still be met.

In order to provide an isochronous communication, and thus also a synchronization of components, the communication clock signal is provided to all the components of the multi-component apparatus. For this purpose, a clock generator that is preferably external both to the components and also to the switch can be use. The length of the communication time window between the communication clock cycles is selected so that it is ensured that communication information items of a particular maximum size, for example, up to 128 bytes or up to 256 bytes, have been passed on via the switch from one component to one, or in the multicast case, a number of addressed components. This means that the frequency of the communication clock signal is selected so that the communication information items passed on or multicasted by the switch reach their targets within the communication time window. With the use of the third generation PCI Express standard, it has been found that a length of the communication time window of 10 µs is excellently suited to ensuring such data transport, for example 256 bytes or 128 bytes.

The communication clock signal offers the basis for a synchronized operation of the components. If a synchronization message exists, for which delivery is ensured not later than the reception, within a communication time window, then for transferring components and all the addressed components, a common relation, and thus an isochronicity in relation to the communication clock signal, is created. This means that, although the communication clock signal is provided to the components by a clock generator, the ultimate creation of the synchronization and the isochronous communication takes place via the already existing communication connections, in particular PCI Express connections, so that other proprietary networks can be dispensed with.

It should be further noted that the multicast capability of the switch is always required if communication information items with a time delay are relevant for a number of components. This is particularly the case for a temporally coordinated control of components, as occurs, for example, in the control computer of a magnetic resonance apparatus. The switch is then configured so as to multicast the communication information to the different addressed components. The switch thus can then be programmed accordingly such that a copy of the arriving communication information is transmitted at each end point, that is, each component that needs the communication information in the corresponding message. The programming of the switch preferably takes place by an entity that has knowledge of the system configuration, for example, a software layer above the driver software of the PCI Express devices.

In summary, the existing communication connections are thus used with the switch, in particular with the multicast function, and are combined with the distribution of a communication clock signal in order to expand the existing communication connection topology, in particular the PCI Express topology, such that isochronous data exchange is possible, and isochronous or partially isochronous networks can be dispensed with. This reduces hardware costs for the multi-component apparatus. Furthermore, fewer communications lines, such as optical fiber lines are needed, so that the overall complexity is also reduced. This permits simpler error correction in the event of a defective component or a defective cable. Drop-out times (down times) of the multi-component apparatus are thereby reduced.

Another advantage in the use of PCI Express connections, wherein the communication connections then form a PCI Express network with the switch, is that PCI Express is a standardized interface that is widely used widely. Therefore, a large number of possible switches are available and many typically used components, such as FPGAs, currently already have a hardwired PCI Express interface. Therefore, in this context, cost and energy can be saved. With each new generation of the PCI Express standard, advantages can be achieved from greater bandwidths and other new properties, so that continuous further development and further cost savings are possible. For the PCI Express standard, a large number of debugging and assessment aids exist in both hardware and software so that, for example, electrical compliance tests for determining the signal quality can be carried out, and thus the reliability and long-term stability of the multi-component apparatus can be increased. Finally, protocol analysis programs also exist that simplify error flagging in the development phase and the system integration, and thus further contribute to reducing the cost and complexity.

Together with a central computer (control computer), the components can form a control system of the multi-component apparatus. At least the digital portion thereof can be further enhanced with corresponding analog assemblies. The central computer system, which can be or include the control computer, can be considered to be the host which communicates via the communication connections and the switch, with the components connected as the periphery. The components can be digital assemblies that together with the associated analog assemblies, specifically control functional units of the multi-component apparatus. In the case of a magnetic resonance device, in particular, as mentioned above, these functional units are temporally coordinated so as to achieve an overall success in the image quality achieved by the magnetic resonance apparatus. As the multi-component apparatus, in a magnetic resonance device the components form a part of the control system that controls the imaging. Specifically, the components can be digital assemblies or control processors or circuits that are grouped together as a combination of digital assemblies and analog assemblies, associated together with a particular functional unit of the magnetic resonance apparatus. Thus, at least one gradient controller and/or a radio-frequency controller and/or a monitoring component and/or a data acquisition component can be used as part of a control system of the magnetic resonance apparatus. Associated functional units are, for example, gradient coils, radio-frequency coils and the like.

In architectures of this type in which the components together with a computer form the control system of the multi-component apparatus, with the computer therefore being regarded as a host and the components as peripheral devices, the communication connections are also used to realize the communication between the computer and the components. In such a case the multi-component apparatus further has a computer that communicates via the switch with the components, wherein the bandwidth available via the communication connections is distributed for an isochronous communication and a mass communication with the computer. Particularly in the case of a magnetic resonance apparatus as the multi-component apparatus, it must be taken that large data quantities, for example, recorded magnetic resonance signals/magnetic resonance data, must be transported (transferred). For this purpose, a certain amount of bandwidth is necessary. This mass communication is not bound to the communication clock signal, but has moderate to high bandwidth requirements. For example, in a magnetic resonance apparatus, one of the components that is associated with an MR data detection unit, can transport magnetic resonance data at, for example, 400 MB/s to the computer that constitutes the final raw data receiver. Other components that control, for example, a radio-frequency pulse emission, can receive communication information from the computer at a data rate of 100 MB/s.

In a preferred embodiment of the present invention, in each case, at least one control command of a control command set is transferred to the synchronized components, for the temporally coordinated cooperation of components, wherein at least one execution time point is associated with each control command in relation to the communication clock signal, and the control commands are executed dependent on the synchronization at their respective execution time points. For example, in the case of a magnetic resonance apparatus, the control command set can implement the progress of a magnetic resonance sequence or generally, for image recording devices as multi-component apparatuses, a scan protocol. Particularly with regard to magnetic resonance, it is essential that functional units of the magnetic resonance apparatus controlled by the components as part of a control system maintain the temporal sequence as exactly as possible. This should be ensured as precisely as possible by the synchronization and the communication clock signal in the control system. The control commands must not originate from one of the other components, but rather as is usual in magnetic resonance apparatuses, the control computer, i.e., the computer system, suitably distributes the corresponding control command set. Thus the control commands are prepared at least partially in advance by the central computer of the multi-component apparatus, independently of the synchronization. In this case, the synchronization message relates to a first execution of a control command. For example, a synchronization message can be prepared by a particular component as a "start signal", so that the execution time points relate to a corresponding communication clock cycle, for example, one that follows. For example, the communication clock cycles can be counted from the synchronization message, for which purpose a corresponding communication clock cycle counter can be realized within the components. In such embodiments, each execution of one or more control commands can be confirmed by corresponding synchronization messages in order to maintain the synchronization continuously.

The inventive method also permits control commands or, more generally, control actions, from component-to-component to be generated dynamically and, on the basis of the isochronous communication, permits a coordinated execution. Thus, in an embodiment of the present invention, within a communication window:

a time-related communication information item is transferred with at least one addressed component by at least one transferring component, in particular, as a synchronization message, to the switch, the communication information is transferred by the switch to the at least one addressed component, and the communication information is received by the at least one addressed component, wherein the communication information is processed in a time-related manner dependent upon the synchronization and the communication clock signal.

In specific terms, the communication information includes at least one execution information item relating to the communication clock signal from the next communication clock cycle, or to the synchronization, and that describes an execution time, and a control command contained within the communication information is carried out at the execution time point.

In the example of a magnetic resonance apparatus as the multi-component apparatus, a component can provide actual values via control commands that can deviate from the target values, and thus require a dynamic reaction, for example with regard to a magnetic field shim. From the resulting time relation, it is known at what time point shim measures or adaptations thereof can be necessary. In particular, it is conceivable that one component can require the other component, at a particular time point related to the present synchronization or at the next communication clock cycle, to carry out a particular control command so as to implement a control action in a self-coordinated manner.

The inventive communication technology can otherwise also be used in the context of a real-time data transfer or data processing. With two components to be operated synchronized, one component can have an alternating buffer in which a communication information item received from the communication partner is stored in a communication time window, while the other portion of the alternating buffer is read out. If a communication information item is omitted, an error entry is generated for the communication time window. Thus, the communication clock signal can also be used for correct clocking of an alternating buffer, particularly where relatively large data streams must be transferred as far as possible in real time. The common communication clock signal ensures that the transferring component transfers the communication information at the correct time point and in the correct communication time window, and the receiving component receives it in the same communication time window, or reads out the previously received communication information. The first communication information item can be acquired as a synchronization message since it is known that the data stream then begins. In this way, the network provided by the communication connections and the switch can also be used to replace a direct connection between two components.

As an example, the transferring component can be an FPGA that periodically transmits communication information in a fixed data format to the receiving components, in particular a DSP. For example, the FPGA can receive a previously encrypted data stream that contains information regarding the SAR loading of a patient to be scanned in a magnetic resonance apparatus as the multi-component apparatus, and pass it on in the described manner to the DSP, which can be associated, for example, with a monitoring component that is to react as rapidly as possible if SAR limit values or the like are exceeded. It should be noted that in such an exemplary configuration, the components and the switch can also be provided on a common circuit board and electrical communication lines can be used. By the use of the synchronized communication time window, it can also be established whether a communication information item, for example, a message in the stipulated data format, is lacking, so that then a corresponding error entry can be generated.

Suitably, the communication clock signal can be transferred by a clock generator in a star configuration of optical communication lines to the components. If latencies (delays) due to path lengths play a significant role, equal-length communication lines can be used for transferring the communication clock signal from the clock generator to the corresponding components. As mentioned above, 10 μs has proved to be a useful value for the length of the communication time window. Naturally, other values are also possible, for example, 5 μs or In an embodiment of the present invention, the communication clock signal is transferred to the components together with a higher-frequency system clock signal. This means that the periodic communication clock signal can be coded into a clock signal that is required anyway for each component. This has the advantage that only one communication line is needed both for the system clock signal and for the communication clock signal.

In an embodiment, the communication clock cycles are coded into the system clock signal by a pulse width modulation and/or an amplitude modulation, and/or the communication clock signal and the system clock signal are transferred overlaid. In the latter case, a filter is used for separating the communication clock signal and the system clock signal. A coding-in of the communication clock signal into the system clock signal can take place, such as by variation of the duty cycle of the system clock signal. Whereas normally a pulse duty factor for the system clock signal of 50:50 is selected, a pulse width ratio of 75:25 or similar can be used for each communication clock cycle. The decoding of the communication clock signal can then take place by the system clock signal being oversampled and the unbalanced duty cycle is thereby detected. Since the system clock signal is in any event multiplied in the component in some applications, because the component requires faster system clock rates, a clock multiplication then can be used for the oversampling. An oversampling can also be required at the start of a type of training phase. As soon as the communication clock cycle has been reliably detected for a particular number of successive sequential events, the detection unit that detects the communication clock cycle can be further operated in a type of free-running mode.

An alternative for passing on the communication clock signal is to embed an additional, low-frequency SYNC information item in a high-frequency system clock waveform, for example, as a 100 MHz system clock signal and a 100 kHz SYNC signal, which are transferred simultaneously via the same communication line and are then separated by a corresponding filter in the component. Another example is amplitude modulation, so that the amplitude of the system clock signal can be increased at the rate of the communication clock signal.

In a further embodiment of the present invention, each communication clock cycle triggers the start of a time counter for measuring time points within the communication time window in at least a part of the components. In order to achieve a higher level of time resolution of the isochronous communication/control than the duration of the communication time window, which is useful for example, in a magnetic resonance apparatus as the multi-component apparatus, each occurrence of the communication clock cycle in the communication clock signal starts a time counter in at least the part of the components, wherein the time counter can be used, for example, every 25 ns with a duration of the communication time window of 10 μs. Thus 400 sub-time windows arise, which can also be referenced, for example, to carry out a control command at the correct time point. If, for example, an execution information item is added to a control command with an execution time point in the third communication clock cycle after 200 ns, this can accordingly be achieved by taking account of the communication clock counter in the context of the isochronous communication and the time counter within the communication time window being incremented after 25 ns, that is, when the time counter reaches the value 8. Thus, a highly accurate, isochronous control of cooperating components of a multi-component apparatus, in particular, a magnetic resonance apparatus is possible.

The present invention also encompasses a multi-component apparatus having:
a number of components,
a switch that produces peer-to-peer communication connections among the components,
a clock generator that provides a periodic communication clock signal to all the components, with a communication time window between two communication clock cycles of the communication clock signal, in which a communication information item of the isochronous communication is transferrable from a transferring component to at least one addressed component, and
a control system that produces synchronization, in relation to the communication clock signal, between at least two of the components by using at least one synchronization message sent via the switch by one of the components to be synchronized to all the other components to be synchronized, in a communication time window.

All the embodiments relating to the method according to the invention are similarly applicable to the inventive multi-component apparatus, with which the above-mentioned advantages can therefore also be obtained. The control computer can be at least partially formed by components and/or control processors of the individual components.

Preferably, the multi-component apparatus is a magnetic resonance apparatus, with the components being control components of a control system of the magnetic resonance device. The control device can additionally contain, apart from the components and the switch, a central computer (control computer) which can also communicate via the switch and the communication lines with the control components. The control components can be and/or include digital assemblies and/or can be associated with a functional unit of the magnetic resonance apparatus, in particular a functional unit that is used in the magnetic resonance imaging. The result is a particularly simple structure of the communication topology for a magnetic resonance apparatus, since merely the transfer of the communication clock signal from the clock generator and the network formed by the switch and the communication line, in particular a PCI Express network, are required, while isochronous communication that fulfills the requirements of the magnetic resonance imaging is still enabled.

DESCRIPTION OF THE PREFERRED EMBODIMENTS

Figure 1:
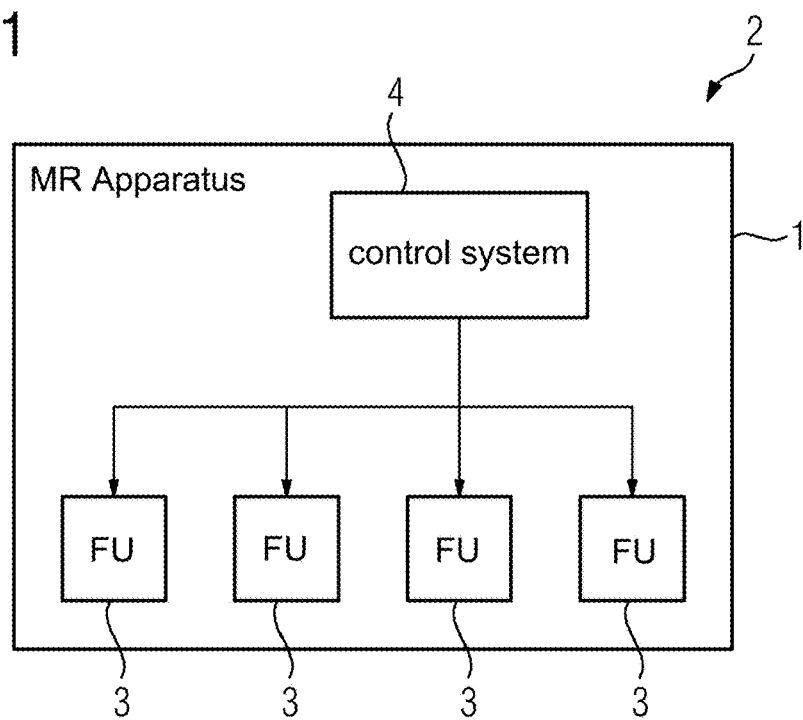
FIG. 1 schematically illustrates basic components of a magnetic resonance apparatus that are relevant to the invention.

FIG. 1 schematically illustrates the basic relevant components of a magnetic resonance apparatus 1 as an example of a multi-component apparatus 2. In order to be able to fulfill its imaging tasks, the magnetic resonance apparatus 1 has a number of functional units 3 that, as is known in principle, can be, for example, a gradient coil arrangement, a radio-frequency coil arrangement, a BO magnetic field arrangement, shim devices, as well as supporting components such as cooling devices and the like. For the coordinated control of these functional units 3, in particular for the purpose of imaging and for receiving magnetic resonance data, the magnetic resonance apparatus 1 also has a control system 4 in which an isochronous communication according to the present invention is realized.

Figure 2:
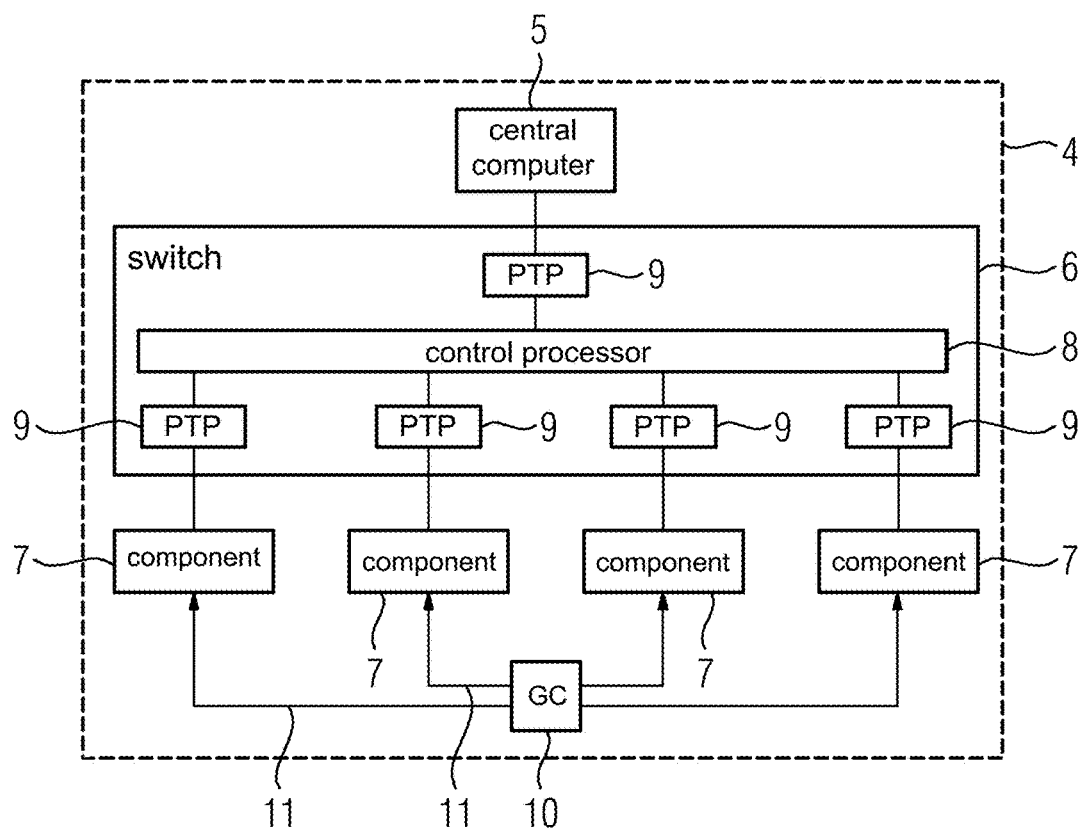
FIG. 2 shows the structure of a control system of the magnetic resonance apparatus.

FIG. 2 shows the structure of the control system 4 in more detail. The control system 4 has, as the host, a central computer 5 that communicates via a PCI Express switch 6 and accordingly by communication connections formed thereby, with further components 7, which can be regarded as peripheral devices. In the present case, the components 7 are control components that each have at least one corresponding digital assembly for controlling at least one functional unit 3. The actual control takes place via corresponding analog assemblies respectively associated with individual digital assemblies. Apart from such control components, the further components 7 can also be used, for example, as monitoring components, such as an SAR monitoring component. The maximum number of components 7 is scalable to the maximum number of interface connections that the switch 6 provides.

The switch 6 has a control processor 8 that forms a virtual PCI bus and constructs peer-to-peer connections between communication partners by corresponding peer-to-peer bridges 9 associated with the terminals for the transmission of communication information. The switch 6 also provides a multicast peer-to-peer function. This means that if a communication information item passes from the central computer 5 or a component 7 to the switch 6, the latter decides for which (at least one) communication partner the communication information item is intended, and passes on the communication information item via the corresponding (at least one) bridge 9 to the corresponding communication partner. Thereby, a target information item can already be associated with the communication information item, which determines the recipient of the communication information. The switch 6 can also be programmed so that a copy of each arriving message is sent to each communication partner that needs the communication information. The corresponding programming of the switch 6 can be implemented by an entity in which the system configuration is known, for example, a corresponding software layer in the control computer 5.

It is also known and ascertainable that, within a particular communication time window, here a duration of 10 µs, the switch 6 can multicast communication information of a particular message size, for example of up to 256 Bytes, to the communication partners. However, exact passage times for the communication information cannot be ensured due to the nature of the PCI Express standard.

In order to permit isochronous communication via the communication connections provided by the switch 6, the control system 4 in accordance with the invention also has a clock generator 10, which is external to the components 7 and the switch 6, that transfers, via optical communication connections 11 (that can have the same length), a communication clock signal in a star formation to all the components 7 for which a synchronization and isochronous communication is to be provided. The respective communication clock cycles define communication time windows of a length, here 10 µs, selected to ensure that communication information reaches the corresponding communication partner, and therefore the addressed component 7, within the communication time window. If, for example, as a type of start signal, a synchronization message is sent to components 7 that are to be synchronized and that are provided for an isochronous communication, all the components 7 involved can begin to count from the next communication clock cycle and therefore have a collective (shared) time counting.

Figure 3:
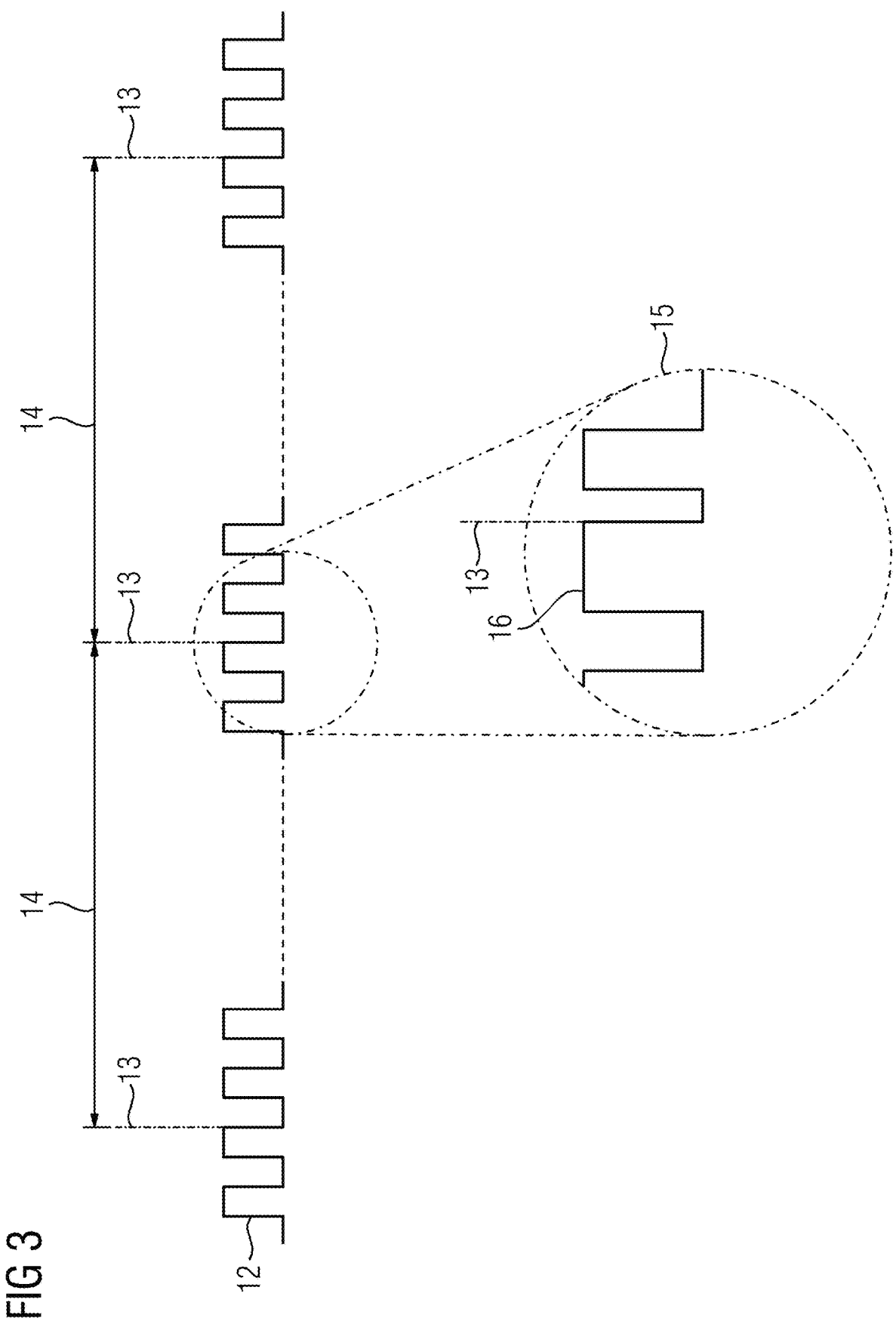
FIG. 3 shows an example of coding a communication clock signal into a system clock signal in accordance with the invention.

The clock generator 10 makes both a system clock signal and the communication clock signal available via the communication lines 11. FIG. 3 shows a coding of the communication clock signal into the higher-frequency system clock signal by pulse width modulation. The system clock signal 12 can have, for example, a frequency of 10 MHz and typically has a pulse duty factor of 50:50. In FIG. 3, in addition to the system clock signal 12, the communication clock cycles 13 of the communication clock signal, which should always follow one another at the temporal spacing of a communication time window 14 (in this case 10 µs), are also indicated. As can be seen in the central portion 15 of the system clock signal 12 (shown enlarged), at the time points of the communication clock cycles 13, in place of the pulse duty factor of 50:50, a pulse duty factor of, for example 75:25 can now always be used (cf. the elongated duty cycle of the pulse 16). Since the components 7 in the present example already derive, from the system clock signal 12, a higher-frequency clock signal, for example 20 MHz, 40 MHz and 80 MHz, an oversampling can be carried out by the components 7. This allows the communication clock cycle 13 is reliably detectable, in particular, also following a corresponding teaching phase.

Naturally, other ways of transferring the system clock signal 12 and the communication clock signal 13 via common communication lines 11 are also conceivable, for example an overlaying (superimposing) of the system clock signal 12 and a SYNC communication clock signal, or even amplitude modulation. In the case of overlaying, for example, a system clock signal 12 of 100 MHz and a SYNC communication clock signal of 100 kHz can be used.

It should be noted that for the typical data traffic, in particular between the control computer 5 and the components 7, which does not make any particular time demands, a reserved portion of the bandwidth of the communication connections can be provided. For example, for a component 7 supplying magnetic resonance data to the control computer 5 as the raw data receiver, a bandwidth of 400 MBytes/s can be provided. Other components 7, such as those that control the emission of pulses in the magnetic resonance data acquisition sequence, can receive data from the control computer 5 at a rate of, for example, 100 MBytes/s, all of this being in addition to the isochronous communication.

Figure 4:
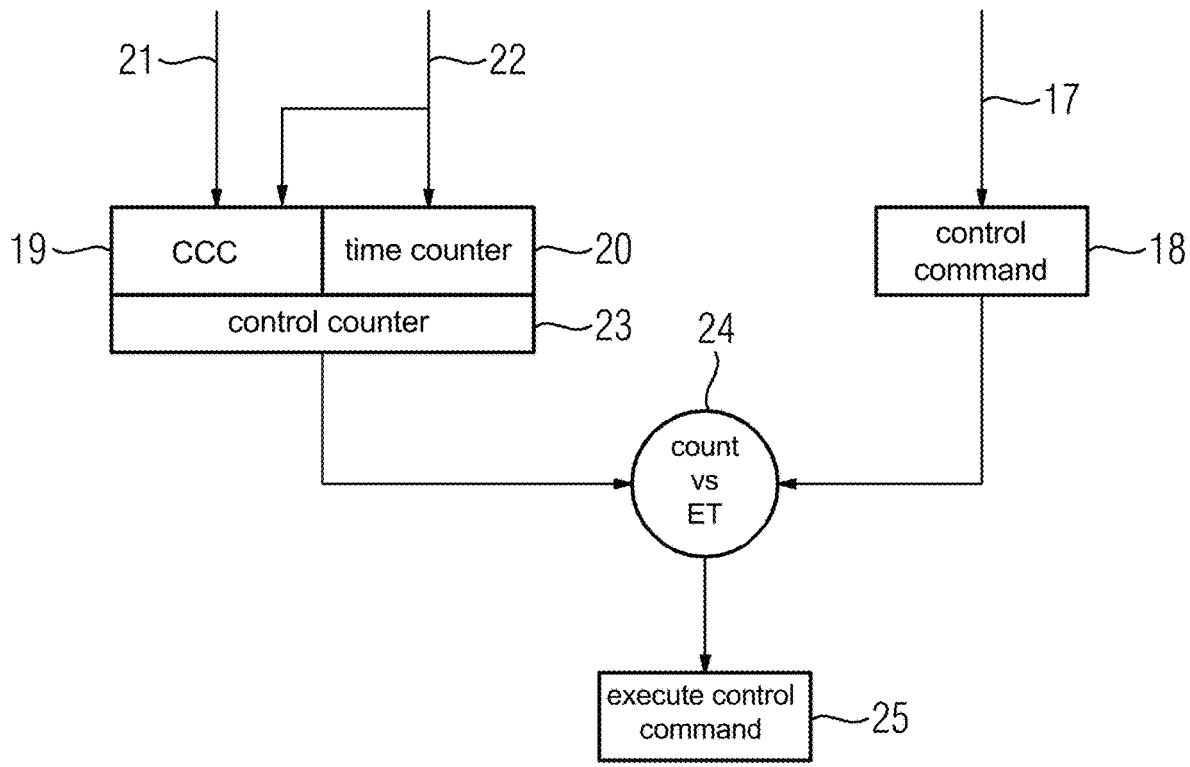
FIG. 4 is a diagram showing a relationship among the coordinated control of components in accordance with the invention.

Once the communication clock cycle 13 is delivered to all the components 7, the basis exists for the synchronized and temporally coordinated operation of the components 7. A more accurate temporal resolution is realized within the components 7 by a time counter therein, which can increment, for example, every 25 ns and is restarted by each communication clock cycle 13, so that highly accurate control sequences matched to one another are possible. In the described example of the magnetic resonance apparatus 1, it is usual, for imaging, for the corresponding control commands of the scan protocol/the magnetic resonance sequence, with its execution time points, to be transferred beforehand and with corresponding execution time points to the components 7, which are then intended to cooperate. FIG. 4 illustrates this concept within a component 7 in more detail.

Regardless of the isochronous communication, as per the arrow 17, the component 7 receives, as symbolized by the box 18, a control command from the control computer 5 together with time information, which defines an execution time. Within the component 7, two counters are operated, specifically a global communication clock counter 19 and a time counter 20. By the synchronization message being passed to all the components 7 to be synchronized, and itself stemming from a component 7 according to the arrow 21, the communication clock counter 19 is started. The synchronization message according to the arrow 21 can be emitted, for example, from a component 7 that executes a first initiating control command. Once the synchronization message arrives within the communication time window 14 in each case, the communication clock counters 19 run synchronously in all the components 7.

The arrow 22 symbolizes the arrival of the communication clock cycle 13 from the clock generator 10. The communication clock cycle 13, first, causes the communication clock counter 19 to be incremented by one, and second, causes the time counter 20 to be restarted. Together, the communication clock counter 19 and the time counter 20 therefore form a control counter 23 that runs synchronously in all the components.

The count of the control counter 23 is now compared in a step 24 with the execution time that is associated with the at least one control command received previously. Given a match, the control command is executed according to the step 25.

Figure 5:
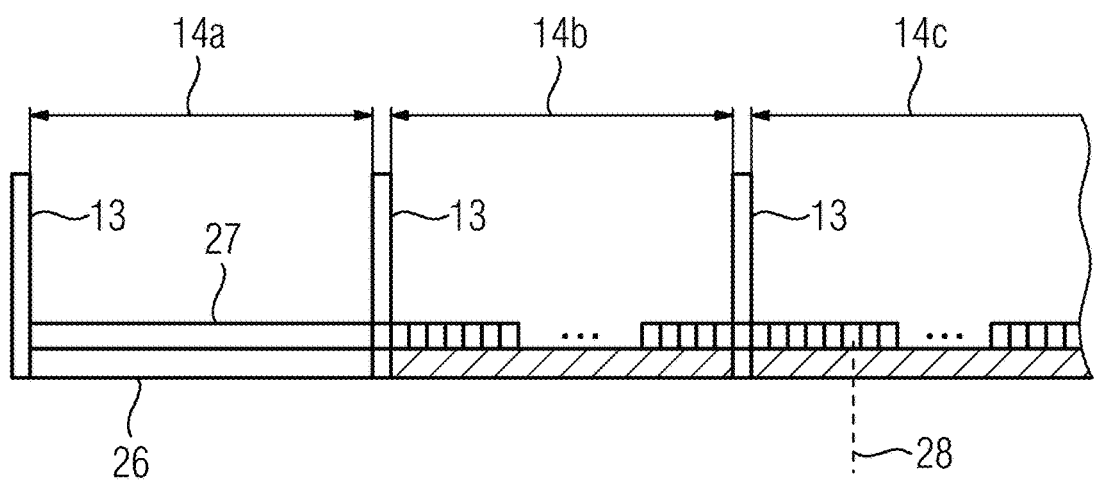
FIG. 5 shows a temporal sequence for carrying out a control command in accordance with the invention.

This will now be described again in greater detail referring to the time progression shown in FIG. 5. It is assumed that the synchronization message is received within the communication time window 14a. This has the result that from then on, with each further communication clock cycle received, the communication clock counter 19 indicated in the bar 26 begins to run and additionally, the communication clock cycle 13 also triggers the counting of the time counter 20 represented by the bar 27 which in this case is incremented, for example, every 25 ns and therefore defines 400 sub-time windows in the communication clock windows 14b, 14c, . . . given a communication time window 14 length of 10 μs.

If now the execution time 28 of 10 μs, 200 ns is assigned to a control command, the control command is executed in the time window 14c at the eighth incrementation of the time counter 20.

It should be noted that control commands need not necessarily be defined in advance by the control computer 5. Rather, the components 7 can also use the isochronous communication among themselves in order to produce a temporal coordination of actions of the components 7. For example, a component 7, in the communication time window 14a, can contain a communication information item with a control command and an associated execution time point related to a counting from the communication time window 14b. Upon receipt of such a communication information item, also acting as a synchronization message, it is therefore also known to the receiving component 7 exactly when the execution of the control command is desired. Such a dynamic provision or adaptation of control commands at run time can be useful, for example, for shim adaptation and/or in relation to an SAR monitoring in the magnetic resonance apparatus 2.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for isochronous communication among components of a multi-component magnetic resonance imaging apparatus, said components communicating via peer-to-peer communication connections produced by a switch, said method comprising:

providing a periodic communication clock signal, from a central computer, together with a higher-frequency system clock signal, to all of said components, said periodic communication clock signal comprising a plurality of successive clock cycles with a communication time window between two immediately successive communication clock cycles, in which a communication information item of the isochronous communication is transferrable from a transferring component, among said plurality of components, to at least one addressed component, among said plurality of components, wherein said communication clock cycles are coded in said system clock signal by pulse width modulation or amplitude modulation; and producing a synchronization, relative to said communication clock signal, between at least two of said plurality of components by sending, via said switch, at least one synchronization method from one of said plurality components to be synchronized to all of the other components in said plurality of components to be synchronized, in said communication time window.

2. A method as claimed in claim 1 comprising using, as said communication connections, optical PCI Express connections.

3. A method as claimed in claim 1 comprising, with said switch, providing multicast peer-to-peer communication connections.

4. A method as claimed in claim 1 comprising, with said central computer, distributing an available bandwidth via said communication connections for the isochronous communication, via a mass communication.

5. A method as claimed in claim 4 comprising preparing said control commands in advance in said central computer, independently of the synchronization.

6. A method as claimed in claim 1 comprising, from said central computer, transferring at least one control command of a control command set to the components to be synchronized, for temporally coordinate cooperation of said components, with at least one execution time point being associated with each control command relative to said communication clock signal, and executing said control commands in the respective components dependent on the synchronization at their respective execution time points.

7. A method as claimed in claim 1 comprising, within a communication window:
transferring a time-related communication information item with at least one addressed component via at least one transferring component, as a synchronization message, to said switch;
transferring the communication information via the switch to said at least one addressed component;
receiving said communication information at said at least one addressed component; and
in said at least one addressed component, processing the communication information in a time-related manner dependent on said synchronization and on said communication clock signal.

8. A method as claimed in claim 7 comprising including, in said communication information, at least one execution information item related to said communication clock signal from a next communication clock cycle, or related to the synchronization, said execution information item describing an execution time and a control command contained within the communication information being implemented at said execution time.

9. A method as claimed in claim 1 comprising transferring said communication clock signal via a clock generator in a star configuration.

10. A method as claimed in claim 1 comprising transferring said communication clock signal via optical communication lines to said components.

11. A method as claimed in claim 1 comprising transferring the communication clock signal and said system clock signal overlaid on each other.

12. A method as claimed in claim 1 comprising, with each communication clock cycle, triggering a start of a time counter in a respective component that measures time points within said communication time window.

13. A method as claimed in claim 1 wherein the magnetic resonance imaging apparatus is a nuclear magnetic resonance imagining apparatus.

14. A multi-component magnetic resonance imaging apparatus comprising:
a plurality of components;
a switch for isochronous communication among said plurality of components via peer-to-peer communication connections produced by said switch; and
a central computer configured to provide a periodic communication clock signal, together with a higher-frequency system clock signal, to all of said components, said periodic communication clock signal comprising a plurality of successive clock cycles with a communication time window between two immediately successive communication clock cycles, in which a communication information item of the isochronous communication is transferrable from a transferring component, among said plurality of components, to at least one addressed component, among said plurality of component, wherein said communication clock cycles are coded in said system clock signal by pulse width modulation or amplitude modulation
wherein the switch is configured to produce a synchronization, relative to said communication clock signal, between at least two of said plurality of components by sending, via said switch, at least one synchronization method from one of said plurality components to be synchronized to all of the other components in said plurality of components to be synchronized, in said communication time window.

15. A multi-component magnetic resonance imaging apparatus as claimed in claim 14 wherein said multi-component apparatus is a magnetic resonance imaging apparatus and wherein said plurality of components, in combination, form respective portions of a control system for controlling imaging by said magnetic resonance imaging apparatus.

16. A multi-component magnetic resonance imaging apparatus as claimed in claim 15 wherein said components forming said control system include at least one of a gradient controller, a radio-frequency controller, a monitoring component, and a data acquisition component.

17. A multi-component magnetic resonance imaging apparatus as claimed in claim 14 wherein the multi-component magnetic resonance imaging apparatus is a nuclear magnetic resonance imagining apparatus.

* * * * *